United States Patent [19]

Kameda

[11] Patent Number: 4,872,934
[45] Date of Patent: Oct. 10, 1989

[54] METHOD OF PRODUCING HYBRID MULTI-LAYERED CIRCUIT SUBSTRATE

[75] Inventor: Eiichi Kameda, Ushiku, Japan
[73] Assignee: Nippon Mektron, Ltd., Tokyo, Japan
[21] Appl. No.: 210,637
[22] Filed: Jun. 23, 1988

[30] Foreign Application Priority Data

Jun. 30, 1987 [JP] Japan .................................. 62-162570

[51] Int. Cl.⁴ .............................................. B32B 31/18
[52] U.S. Cl. ..................................... 156/250; 156/253; 156/257; 156/267; 156/268; 29/830; 361/386; 361/391; 428/901
[58] Field of Search ............... 156/150, 250, 253, 257, 156/267, 268; 29/830; 361/386, 398; 428/901

[56] References Cited

U.S. PATENT DOCUMENTS

| | | | |
|---|---|---|---|
| 4,149,219 | 4/1979 | Kraft .................................... | 361/386 |
| 4,338,149 | 7/1982 | Quaschner .......................... | 156/250 |
| 4,495,546 | 1/1985 | Nakamura et al. ................. | 361/398 |
| 4,715,928 | 12/1987 | Hamby .................................. | 156/150 |

*Primary Examiner*—Caleb Weston
*Attorney, Agent, or Firm*—Chilton, Alix & Van Kirk

[57] ABSTRACT

A method for producing a hybrid multi-layered circuit substrate which utilizes prefabricated flexible printed circuit(s) which are rigidized in areas which define high density hybrid circuits. The hybrid circuit regions are formed by disposing copper-lined sheets on both surfaces of the flexible circuit, adhesively bonding the copper-lined sheets to the flexible circuit, forming through-hole conductors and etching a circuit pattern in the copper layer of the lined sheets. The copper-lined sheets are initially general coextensive in size and shape with the flexible circuit and are subsequently severed so that the copper-lined sheets remain only in the hybridized portions of the product. Separation is achieved by mechanically punching along predetermined boundaries and is facilitated by providing either any elongated narrow through-hole at the boundary of the hybrid circuit from which the flexible circuit will extend the end product or by forming a groove in the copper-lined sheets at such boundary.

20 Claims, 2 Drawing Sheets

METHOD OF PRODUCING HYBRID MULTI-LAYERED CIRCUIT SUBSTRATE

BACKGROUND OF THE INVENTION (1) Field of the Invention

This invention relates to a method of producing a hybrid multi-layered circuit of the type having rigid circuit substrates, each of which is subjected to a through-hole conductor formation treatment, affixed at a preselected location(s) and in registration with one another on both surfaces of a flexible circuit substrate. More particularly, the present invention is directed to a method of producing a hybrid multi-layered circuit wherein the opposing exposed surfaces of a flexible substrate sheet or sheets, having electrical circuitry previously provided thereon, are bonded to substantially inflexible copper-lined sheets in regions which are to be hybridized, the copper-lined sheets being subsequently transformed into rigid circuits, the method making it possible to carry out continuously through hole conductor formation and circuit pattern formation treatments at the hybridized portion of the flexible substrate without exerting any adverse influences on the flexible circuit substrate.

(2) Description of the Prior Art

Hybrid multi-layered circuit substrates are known in the art. Such hybrid circuit substrates offer enhanced component packaging density when compared to conventional flexible printed circuits. In a hybrid circuit, rigid circuit substrates are bonded to a flexible circuit substrate at a preselected location or locations. Hybrid multi-layered circuit substrates have generally been produced by the steps of separately preparing a flexible circuit substrate and rigid circuit substrate(s), bonding the rigid circuit substrate(s) to that portion of the flexible circuit substrate which is to be hybridized and multi-layered, and subsequently forming a pre-determined mutual conduction connection between the flexible circuit substrate and the rigid circuit substrate(s). The prior art technique, wherein the flexible and rigid circuit substrates were preformed, imposed serious limitations on the ability to interconnect the circuits, i.e., the conductive patterns, on the flexible and rigid substrates.

The difficulty in producing the desired interconnection pattern, in turn, seriously limited the ability to produce a hybrid multi-layered circuit substrate having high reliability and a high component packaging density. While it would be desirable to employ highly reliable, miniaturizable through-hole conductor means at the hybridized portion, i.e., where the flexible and rigid circuit substrates are bonded together, in actual fact complicated plating and masking techniques have had to be employed. Furthermore, in accordance with the prior art, considerable care must be taken to ensure against damage of the flexible circuit, both in the hybridized and unhybridized regions, during the process of producing the hybridized circuit portions and, particularly, during formation of the through-hole connections between the flexible and rigid substrates.

Japanese Patent Publication No. 12400/1986 discloses a method of producing a hybrid multi-layered circuit substrate wherein a rigid circuit substrate is laminated to a portion of a flexible circuit substrate while accomplishing sequentially the necessary electrical interconnection between the circuit patterns. The technique of the referenced Japanese patent publication includes the steps of forming through-holes in a base film which is employed for forming the flexible printed circuit substrate, through-hole plating of these holes, forming a pre-determined circuit pattern on one of the surfaces of the base film in association with the plated through-holes, disposing an adhesive layer in the region where the flexible circuit is to be hybridized and laminating a rigid substrate, the rigid substrate having separation perforations along a boundary line(s), to the base film. The boundary line(s) defined the region of the multi-layered circuit which were to be hybridized by permanent affixation of a rigid circuit substrate to the flexible circuit substrate comprising the base film. The technique being described also required that a resin be packed into the separation perforations in the rigid substrate. Thereafter, the electrical interconnection through-holes were drilled in the rigid substrate in the region which was to form part of the hybrid multi-layered circuit and these through-holes were subsequently plated. Next, the requisite circuit patterns were formed on the exposed surface of the rigid substrate in the multi-layered region and on the exposed surface of the base film in association with the through-holes. Finally, employing the separation perforations, the laminate member consisting of the flexible circuit substrate and bonded rigid circuit substrate is punched from the remaining laminate thus resulting in the removal of the rigid substrate in the non-multi-layered region. In accordance with the above-described method, it is possible to produce, through continuous steps, a hybrid multi-layered circuit substrate having a multi-layered region or regions consisting of flexible and rigid substrates and having though-hole connections between the circuit patterns on the flexible and rigid substrates, the hybridized circuit having non-multi-layered regions consisting of only the flexible circuit substrate.

In accordance with the hybrid multi-layered circuit production technique described above, however, the labor intensive step of packing the resin into the separation perforations that define the boundaries between the multi-layered region and non-multi-layer regions is required. Further, after the resin has been packed into these separation perforations, a further step of cleaning the rigid circuit substrate in the region of the separation perforations was required in order to permit the subsequent formation of a circuit pattern on the rigid substrate. The steps of packing the through-holes and cleaning the substrate complicate the method of manufacture. Also, and perhaps more importantly, the through-hole plating layer adheres to the circuit pattern on the flexible circuit substrate and this plating layer limits both mechanical flexibility and the flexibility in circuit design. A particularly significant limitation on the above-described method is that it precludes the use of a prefabricated flexible circuit substrate and thus, in many applications, increases the cost of production of a hybrid circuit.

SUMMARY OF THE INVENTION

The present invention overcomes the above-discussed and other deficiencies of the prior art by providing a novel method of producing a hybridized printed circuit which is provided with a rigid circuit substrate at least at a first portion of a flexible circuit substrate, which has high reliability and a high component packaging density, which offers a high degree of circuit design flexibility, and which does not diminish any of the desired physical characteristics of the flexible circuit substrate.

It is, accordingly, an object of the present invention to provide a method of producing a hybridized multi-layered printed circuit and, particularly, such a circuit wherein the formation of through-hole conductors and the formation of circuit patterns on the rigid substrate(s) can be achieved at the hybrid portions of the circuit without exerting any adverse influences on the flexible portions of the circuit.

It is another object of the present invention to provide a method of producing a hybrid multi-layered circuit wherein copper-lined sheets are employed for forming the rigid circuit substrate(s), these copper-lined sheets being bonded to both surfaces of a flexible circuit substrate(s) that has been formed in advance. In accordance with the preferred embodiment of the invention, the copper-lined sheets are hermetically sealed to the flexible circuit substrate and the through-hole conductors and the circuit patterns are subsequently formed without adversely effecting the flexible circuit substrate. The method of the invention thus results in a hybridized circuit wherein a flexible circuit substrate is provided, at a preselected portion or portions, with a high density hybrid circuit portion which includes a rigid circuit substrate.

It is a further object of the present invention to provide a method of producing a hybrid multi-layered circuit substrate which includes a step of mechanically separating, by means of punching or the like, the unnecessary portions of the rigid circuit substrate. This mechanical separation step is permitted by the provision of separation through-holes for example slots, or grooves in the copper-lined sheets which define the rigid circuit substrate. The punch-separation step of the present invention permits the delimiting of a hybrid portion on a flexible circuit substrate without imparting any damage to the flexible circuit substrate.

In order to accomplish the above-stated objects, the present invention provides a method of producing a hybrid multi-layered circuit substrate which comprises the steps of disposing a copper-lined sheet, which is subsequently to be formed into a rigid circuit substrate and which has integral mechanical separation means at a boundary portion between a flexible portion and a to be hybridized portion of a flexible circuit substrate, on each surface of a pre-formed flexible circuit carrying substrate sheet. Both of the copper-lined sheets are bonded to the flexible circuit sheet by means of an adhesive, the bonding being accomplished only in regions of the flexible substrate sheet which are to be hybridized and not in those regions which are to remain flexible in the end product. Subsequently, through-hole connectors are produced between the copper-lined sheets and the flexible circuit substrate in the hybrid region. Thereafter, a pre-determined circuit pattern is formed on the exposed surface of both of the copper-lined sheets in the hybrid circuit region. Next, employing a punching treatment, the copper-lined sheets are severed along the outer profile line of the hybrid circuit portion so as to separate the "unused" portion of the copper-lined sheets, thus producing a product wherein a rigid circuit substrate is present on both surfaces of the flexible circuit only in the hybrid circuit region.

The separation technique described above, which is performed on the copper-lined sheets, is permitted by the formation of thin elongated separation through-holes, i.e., slots or grooves, in the copper-lined sheets. When separation through-holes for example separation slots, are employed, a mask is disposed on the copper-lined sheets over the separation slots during the formation of through-hole conductors. When separation grooves are employed, the grooves are provided in the sides of the copper-lined sheets which face the flexible circuit substrate and, as noted, the copper-lined sheets are adhesively bonded to the flexible circuit substrate sheet. Accordingly, masking, is not required during the through-hole conductor formation process since there is no danger of permeation of the plating solution onto the underlying flexible circuit portion.

BRIEF DESCRIPTION OF THE DRAWINGS

The present invention may be better understood, and its numerous objects and advantages will become apparent to those skilled in the art, by reference to the accompanying drawing wherein like reference numerals refer to like elements in the several figures and in which.

DESCRIPTION OF THE DISCLOSED EMBODIMENTS

Figure 1:
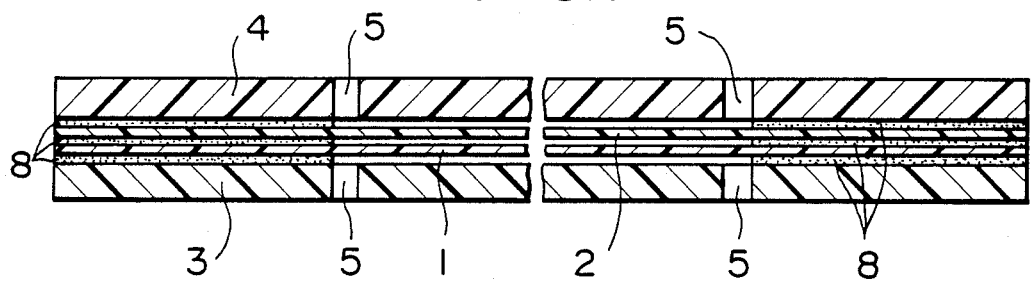
FIG. 1 is a schematic cross-sectional side elevation view which depicts an intermediate stage in the practice of a first embodiment of the invention.

With references now to the drawings, a hybridized circuit in accordance with the present invention may comprise either a single flexible printed circuit or, where a large number of information-bearing signals are to be handled, plural or multilayer flexible substrates may be employed. As depicted in FIG. 1, a pair of flexible circuits substrates, i.e., flexible plastic films which support electrical circuit patterns, are indicated at 1 and 2. The circuit substrates 1 and 2 may, as necessary, include circuitry on one or both surfaces thereof. A significant advantage offered by the present invention resides in the fact that the circuits 1 and 2 may be preformed using conventional techniques. FIG. 1, as noted above, represents an intermediate stage in the fabrication of a hybridized circuit. As shown in FIG. 1, a pair of copper-lined rigid sheets 3 and 4 have been secured, by means of an adhesive 8, to the outwardly-facing surfaces of flexible circuit substrates 1 and 2. In the resulting laminate, as shown in FIG. 1, a copper foil layer will be provided on the exposed faces of sheets 3 and 4. The adhesive 8 is discontinuously applied, i.e., the sheets 3 and 4 are adhesively bonded to respective flexible circuit substrates 1 and 2 only in those regions where the resulting product is to be hybridized. Accordingly, in those regions where the end product will not include a multi-layer hybrid circuit having both flexible and rigid circuit substrates, the adhesive 8 will not be employed.

Figure 2:
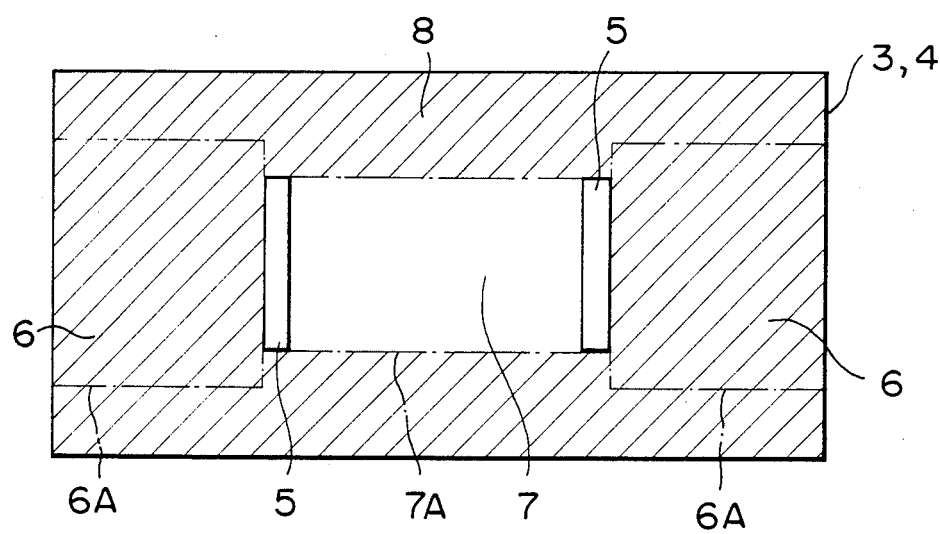
FIG. 2 is a plan view of the partially fabricated hybrid circuit of FIG. 1.
Figure 3:
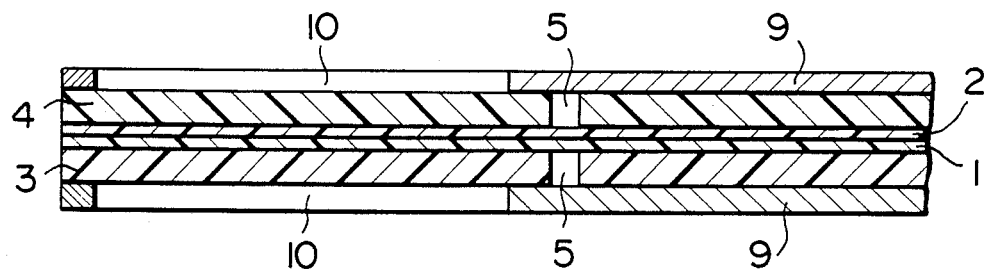
FIG. 3 is a view similar to FIG. 1 which depicts a further step in the practice of the process of a first embodiment of the invention.
Figure 4:
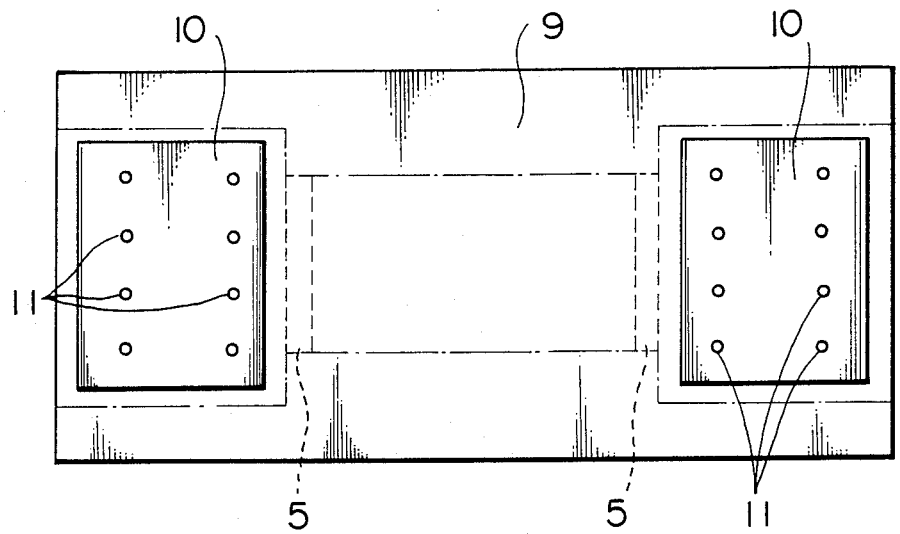
FIG. 4 is a view similar to FIG. 2 which represents the hybrid circuit fabrication stage of FIG. 3.

In order to facilitate the removal of the sheets 3 and 4 from the end product in the regions which are not to be hybridized, for example region 7 of FIG. 2, in accordance with a first embodiment of the invention, thinly elongated separation through-holes or slots 5 are formed in sheets 3 and 4 at the boundary between the hybrid and flexible portions, respectively 6 and 7, of the end product. The through-holes 5 form separation means which permit later use of a punch-separation step. Referring to FIGS. 3 and 4, when the separation through-holes 5 are employed, subsequent to the adhesive bonding step which results in the product depicted in FIGS. 1 and 2, a masking layer 9 is applied. Layer 9 consists of a plastic film or the like which is capable of being pealed off the sheets 3 and 4 after through-hole connections have been produced. As may be seen from FIGS. 3 and 4, the mask will leave central portions 10 of each of copper-lined sheets 3 and 4 exposed. As represented in FIG. 4, employing conventional techniques, through-hole connections 11 are formed in the exposed regions 10, employing drilling and non-electrolytic plating. The through-hole connection formation step produces the desired electrical interconnection pattern between the circuits on the flexible circuit substrates and the copper-lined sheets. After the through-hole conductors are formed, the appropriate circuit patterns are etched into the copper on the exposed surfaces of sheets 3 and 4 in the regions 10.

Figure 5:
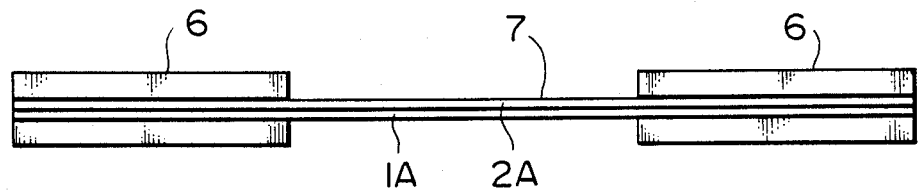
FIG. 5 is a schematic side-elevation view of the results of practice of the technique represented by FIGS. 1-4.

Referring jointly to FIGS. 2 and 5, after the mask layers 9 have been removed, a mechanical separation step is performed. This separation step, in accordance with the invention, comprises applying a punching force with a suitable tool along the profile lines 6A and 7A. The punching encompasses the ends of the separation through-holes 5. The punching step produces the product represented in FIG. 5 which is a hybridized circuit comprising hybrid circuit portions 6 interconnected by flexible circuit portion 7. The unused portions of the copper-lined sheets 3 and 4, which initially overlayed the flexible portion 7 of the end product, are removed as a consequence of the punching step since sheets 3 and 4 are not bonded to respective flexible circuit substrates 1 and 2 in the region 7.

In the above-described embodiment, the punch-separation step is permitted thorough the use of separation slots/through-holes 5 in the copper-lined sheets 3 and 4 which form the rigid circuit substrates. As noted, the use of the separation through-holes 5 dictates the use of a mask layer 9 during the fabrication of the through-hole connections and the etching of the circuit pattern on the sheets 3 and 4. The employment of a mask layer 9 will somewhat decrease the size of the areas 10 which are available for circuit fabrication. In situations where this appears to be a problem, or if further insurance against the permeation of plating solution into the separation-hole 5 is deemed necessary or desirable, the separation through-holes 5 may be replaced by grooves 5A as shown in FIG. 6.

Figure 6:
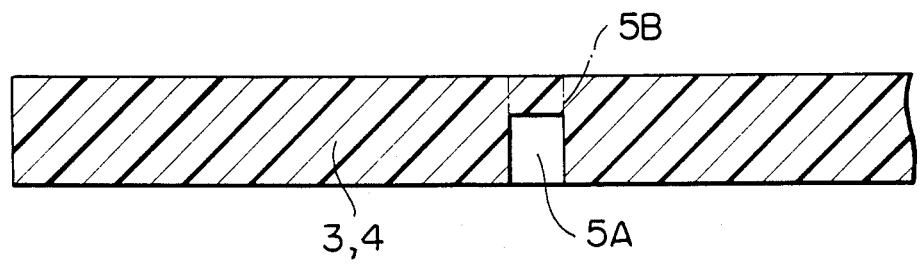
FIG. 6 is a partial side elevation view of a rigid circuit substrate which would be employed in the practice of a second embodiment of the invention.

If copper-lined sheets having the grooved configuration of FIG. 6 are employed in the practice of the present invention, the grooves 5A will be faced inwardly, i.e. toward the flexible printed circuit substrates 1 and 2. The hybrid circuit fabrication technique will otherwise be the same as described above except that the application and subsequent removal of the mask layer 9 will not be required. After the through-hole connections have been made and the desired circuit patterns etched on the portions of sheets 3 and 4 which are to form part of the end product, the portions 5B of the sheets 3 and 4 which are in alignment with the grooves 5A are removed through the use of a suitable cutting tool. Thereafter, the punch-separation technique as described above, may be performed to produce an end product as represented in FIG. 5.

The embodiment of the invention which employs the grooves 5A rather than the separation through-holes 5 has the advantage that it does not impose any limitation on circuit design, i.e., the entire area of the surface of sheets 3 and 4 which will be exposed at the hybrid circuit portions in the end product will be available for circuit formation. The alternate technique employing the grooves 5A in the sheets 3 and 4 insures against permeation of plating solution into the grooves 5A, because of the sealing of the sheets 3 and 4 to the flexible circuit substrates by use of the adhesive. Thus, there will be no plating of the grooves 5A. This, in turn, enables the formation of a circuit pattern on sheets 3 and 4 in the proximity of grooves 5A.

In each of the described embodiments of the present invention, partial punching can be made in advance along the outer profile line 7A at the flexible portion 7 of each flexible circuit substrate. It is also possible to provide a circuit pattern on the inwardly-facing surfaces of the rigid substrates 3 and 4, i.e., the rigid circuit substrates may be at least in part prefabricated and, subsequently, adhesively bonded to the flexible circuit substrates.

In accordance with the present invention, the copper-lined sheets which subsequently form the rigid circuit substrates are preferably bonded to both surfaces of pre-fabricated flexible circuit substrate sheets in such a manner as to hermetically seal the flexible circuit substrate sheet(s) located between the copper-lined sheets. Thereafter, the formation of the through-hole conductors and the formation of the circuit pattern on the exposed sides of the rigid circuit substrates may be carried out. Thus, the present invention can provide a partial hybrid multi-layered type flexible circuit substrate having, in the hybridized portion thereof, high-density circuit patterns and circuit component receiving capability and having high reliability. The high degree of reliability results, in part, from the fact that the flexible surface substrates, particularly in the flexible portions thereof, are not adversely effected during the through-hole plating and the subsequent hybrid circuit pattern formation.

Since punch-separation is permitted by the use of separation slots or grooves which are formed in the copper-lined sheets which define the rigid circuit substrates, the portions of the copper-lined sheets which define the hybrid circuit can be separated from those portions of the copper-lined sheets which overlie the flexible circuit portion easily and without damaging the flexible circuit substrate.

In accordance with the embodiment of the invention which employs grooves in the copper-lined sheets to enable punch-separation, extremely high circuit pattern density can be achieved since the masking of a portion of the rigid circuit substrates is unnecessary.

As will be obvious to those skilled in the art from the preceding discussion, the present invention provides a highly advantageous technique for the production of hybrid multi-layered circuits of the type of which have rigid circuit substrates disposed at portions of a flexible circuit substrate.

While preferred embodiments have been described, various modifications and substitutions may be made thereto without departing from the spirit and scope of the invention. Accordingly, it is to be understood that the present invention has been described by way of illustration and not limitation.

What is claimed is:

1. A method of producing a hybrid multi-layered circuit substrate comprising the steps of:
    disposing first and second sheets having a layer of copper on at least a first side thereof on respective opposite surfaces of a flexible circuit substrate means in registration with one another, the flexible circuit substrate means having formed thereon a predetermined conductive circuit pattern, said first and second sheets having integral separation means which at least in part define a boundary between a flexible portion and a rigidized hybrid portion of a multi-layer hybrid circuit substrate to be produced;
    adhesively bonding said first and second sheets to said flexible circuit substrate means only in a region of the flexible circuit substrate means which is to become part of a hybrid circuit in the multi-layered circuit substrate;
    forming through-hole conductors between said first and second sheets and said flexible circuit substrate means at said hybrid portion;
    producing a pre-determined circuit pattern on both of said first and second sheets within the bounds of said hybrid portion; and
    severing said first and second sheets along the desired outer profile of said hybrid circuit portion and along the desired outer profile line of the flexible circuit portion to produce a hybrid multi-layered circuit substrate having a flexible portion and a rigid hybrid portion, the profile line of the flexible circuit portion encompassing said separation means.

2. A method of producing a hybrid multi-layered circuit substrate according to claim 1 wherein said flexible circuit substrate means includes a plurality of flexible circuit substrate sheets, the outwardly facing surfaces of the outermost of said flexible circuit substrate sheets being bonded and laminated to respective of said first and second sheets in a region which is to form a rigidized hybrid portion of said hybrid circuit substrate.

3. A method of producing a hybrid multi-layered circuit substrate according to claim 2 wherein each of said first and second sheets is a duplex copper-lined sheet, and wherein said method includes the step of forming in advance a predetermined circuit pattern on at least one of said first and second sheets in the region thereof which faces said flexible circuit substrate means.

4. A method of producing a hybrid multi-layered circuit substrate according to claim 2 wherein said separation means consists of through-holes, and wherein said method further comprises masking each of said first and second sheets inclusive of said separation means through-holes prior to forming the through-hole conductors.

5. A method of producing a hybrid multi-layered circuit substrate according to claim 2 further comprising the step of partially pre-punching said flexible circuit substrate means along an outer profile line which defines the flexible portion of the hybrid circuit being produced.

6. A method of producing a hybrid multi-layered circuit substrate according to claim 4 wherein the step of masking comprises applying a peelable plastic film to said first and second sheets.

7. A method of producing a hybrid multi-layered circuit substrate according to claim 4 further comprising the step of partially pre-punching said flexible circuit substrate means along an outer profile line which defines the flexible portion of the hybrid circuit being produced.

8. A method of producing a hybrid multi-layered circuit substrate according to claim 4 wherein each of said first and second sheets is a duplex copper-lined sheet, and wherein said method includes the step of forming in advance a predetermined circuit pattern on at least one of said first and second sheets in the region thereof which faces said flexible circuit substrate means.

9. A method of producing a hybrid multi-layered circuit substrate according to claim 2 wherein said separation means consists of grooves which face the surfaces of said flexible circuit substrate sheet, said through-hole conductors being formed within said hybrid portion without masking of said first and second sheets.

10. A method of producing a hybrid multi-layered circuit substrate according to claim 9 wherein the step of severing comprises cutting through said first and second sheets in the vicinity of said grooves after said through-hole conductors are formed and then punching the hybrid circuit substrate from the laminate of flexible substrate means and first and second sheets.

11. A method of producing a hybrid multi-layered circuit substrate according to claim 10 wherein each of said first and second sheets is a duplex copper-lined sheet, and wherein said method includes the step of forming in advance a predetermined circuit pattern on at least one of said first and second sheets in the region thereof which faces said flexible circuit substrate means.

12. A method of producing a hybrid multi-layered circuit substrate according to claim 10 further comprising the step of partially pre-punching said flexible circuit substrate means along an outer profile line which defines the flexible portion of the hybrid circuit being produced.

13. A method of producing a hybrid multi-layered circuit substrate according to claim 1 wherein the flexible circuit substrate means is provided with relief along the outer profile line of said flexible portion of the hybrid circuit substrate to be produced.

14. A method of producing a hybrid multi-layered circuit substrate according to claim 1 wherein each of said first and second sheets is a duplex copper-lined sheet, and wherein said method includes the step of forming in advance a predetermined circuit pattern on at least one of said first and second sheets in the region thereof which faces said flexible circuit substrate means.

15. A method of producing a hybrid multi-layered circuit substrate comprising the step of:
    disposing first and second sheets having a layer of copper on at least a first side thereof on respective opposite surfaces of a flexible circuit substrate means in registration with one another, the flexible circuit substrate means having formed thereon a predetermined conductive pattern, at least one of said first and second sheets having a pattern of separation through-holes which at least in part define a boundary between a flexible portion and a rigidized hybrid portion of a multi-layer hybrid circuit substrate to be produced;
    adhesively bonding said first and second sheets to said flexible circuit substrate means only in a region of the flexible circuit substrate means which is to become part of a hybrid circuit in the multi-layered circuit substrate;

masking each of said first and second sheets inclusive of said separation through-holes;

forming through-hole conductors between said first and second sheets and said flexible circuit substrate means at said hybrid portion;

producing a pre-determined circuit pattern on both of said first and second sheets within the bounds of said hybrid portion; and severing said first and second sheets along the desired outer profile of said hybrid circuit portion and along the desired outer profile line of the flexible circuit portion to produce a hybrid multi-layered circuit substrate having a flexible portion and a rigid hybrid portion, the profile line of the flexible circuit portion encompassing said separation through-holes.

16. A method of producing a hybrid multi-layered circuit substrate according to claim 15 wherein the step of masking comprises applying a peelable plastic film to said first and second sheets.

17. A method of producing a hybrid multi-layered circuit substrate comprising the steps of:

disposing first and second sheets having a layer of copper on at least a first side thereof on respective opposite surfaces of a flexible circuit substrate means in registration with one another, the flexible circuit substrate means having formed thereon a predetermined conductive circuit pattern, at least one of said first and second sheets having grooves formed in a surface thereof, said grooves at least in part defining a boundary between a flexible portion and a rigidized hybrid portion of a multi-layer hybrid circuit substrate to be produced;

adhesively bonding said first and second sheets to said flexible circuit substrate means only in a region of the flexible circuit substrate means which is to become part of a hybrid circuit in the multi-layered circuit substrate, the first and second sheets being bonded to said flexible circuit substrate means such that said grooves face said flexible circuit substrate means;

forming through-hole conductors between said first and second sheets and said flexible circuit substrate means at said hybrid portion;

producing a pre-determined circuit pattern on both of said first and second sheets within the bounds of said hybrid portion; and severing said first and second sheets along the desired outer profile of said hybrid circuit portion and along the desired outer profile line of the flexible circuit portion to produce a hybrid multi-layered circuit substrate having a flexible portion and a rigid hybrid portion, the profile line of the flexible circuit portion encompassing said grooves.

18. A method of producing a hybrid multi-layered circuit substrate according to claim 17 wherein the step of severing comprises cutting through said first and second sheets in the vicinity of said grooves after said through-hole conductors are formed and then punching the hybrid circuit substrate from the laminate of flexible substrate means and first and second sheets.

19. A method of producing a hybrid multi-layered circuit substrate according to claim 17 wherein each of said first and second sheets is a duplex copper-lined sheet, and wherein said method includes the step of forming in advance a predetermined circuit pattern on at least one of said first and second sheets in the region thereof which faces said flexible circuit substrate means.

20. A method of producing a hybrid multi-layered circuit substrate according to claim 17 further comprising the step of partially pre-punching said flexible circuit substrate means along an outer profile line which defines the flexible portion of the hybrid circuit being produced.

* * * * *